United States Patent
Rust-Nguyen (10) Patent No.: US 12,349,267 B1
(45) Date of Patent: Jul. 1, 2025

(54) APPARATUS, SYSTEM, AND METHOD FOR ACHIEVING CERTAIN CHARACTERISTICS IN STACKED VIAS FORMED THROUGH MULTILAMINATE CIRCUIT BOARDS

(71) Applicant: Juniper Networks, Inc., Sunnyvale, CA (US)

(72) Inventor: Dylan G. Rust-Nguyen, Los Gatos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 171 days.

(21) Appl. No.: 18/300,925

(22) Filed: Apr. 14, 2023

(51) Int. Cl.
*H05K 1/02* (2006.01)
*H05K 1/11* (2006.01)
*H05K 3/46* (2006.01)

(52) U.S. Cl.
CPC .......... *H05K 1/0218* (2013.01); *H05K 1/115* (2013.01); *H05K 3/4614* (2013.01); *H05K 2201/0195* (2013.01); *H05K 2201/096* (2013.01)

(58) Field of Classification Search
CPC ...... H05K 1/0218; H05K 1/115; H05K 1/116; H05K 1/0195; H05K 2201/096
See application file for complete search history.

(56) References Cited

U.S. PATENT DOCUMENTS

| | | | |
|---|---|---|---|
| 2008/0121422 A1* | 5/2008 | Karasawa | H05K 1/115 174/262 |
| 2014/0305688 A1* | 10/2014 | Matsumoto | H05K 1/115 174/262 |
| 2022/0095455 A1* | 3/2022 | Mason | H05K 3/423 |
| 2022/0287174 A1* | 9/2022 | Kim | H05K 3/4688 |
| 2023/0352383 A1* | 11/2023 | Saraswat | H01L 23/49838 |

* cited by examiner

*Primary Examiner* — Roshn K Varghese
(74) *Attorney, Agent, or Firm* — Greenberg Traurig, LLP (57) ABSTRACT

A disclosed apparatus may include (1) a multilaminate circuit board that includes multiple layers whose dielectric values differ from one another and (2) at least one stacked via formed through the multilaminate circuit board, wherein the stacked via comprises (A) a first sub-laminate via that spans a first layer included in the multiple layers and is characterized by at least one feature and (B) a second sub-laminate via that spans a second layer included in the multiple layers and is characterized by at least one other feature. Various other apparatuses, systems, and methods are also disclosed.

14 Claims, 5 Drawing Sheets

APPARATUS, SYSTEM, AND METHOD FOR ACHIEVING CERTAIN CHARACTERISTICS IN STACKED VIAS FORMED THROUGH MULTILAMINATE CIRCUIT BOARDS

BACKGROUND

In today's world of vast computing technology, telecommunications devices are continually evolving to meet customers' needs and/or demands. For example, telecommunications equipment manufacturers often undertake efforts to increase the data rates of their telecommunications devices. To support these increased data rates, some manufacturers may favor the use of multilaminate circuit boards, which include and/or represent multiple layers laminated together.

Unfortunately, these multilaminate circuit boards may introduce and/or cause certain changes and/or inconsistencies from one layer to another. For example, a multilaminate circuit board that supports high data rates may include and/or form a stacked via. In this example, the stacked via may introduce and/or cause undesirable reflections and/or interference in connection with the high data rates. The instant disclosure, therefore, identifies and addresses a need for apparatuses, systems, and methods for achieving certain characteristics in stacked vias formed through multilaminate circuit boards to mitigate such undesirable reflections and/or interference.

SUMMARY

As will be described in greater detail below, the instant disclosure generally relates to apparatuses, systems, and methods for achieving certain characteristics in stacked vias formed through multilaminate circuit boards. In one example, an apparatus for accomplishing such a task may include (1) a multilaminate circuit board that includes multiple layers whose dielectric values differ from one another and (2) at least one stacked via formed through the multilaminate circuit board, wherein the stacked via comprises (A) a first sub-laminate via that spans a first layer included in the multiple layers and is characterized by at least one feature and (B) a second sub-laminate via that spans a second layer included in the multiple layers and is characterized by at least one other feature.

Similarly, a system for accomplishing such a task may include (1) at least one electrical component and (2) a multilaminate circuit board communicatively coupled to the electrical component, wherein the multilaminate circuit board includes multiple layers whose dielectric values differ from one another, and (3) at least one stacked via formed through the multilaminate circuit board, wherein the stacked via comprises (A) a first sub-laminate via that spans a first layer included in the multiple layers and is characterized by at least one feature and (B) a second sub-laminate via that spans a second layer included in the multiple layers and is characterized by at least one other feature.

A corresponding method may include (1) creating a multilaminate circuit board by laminating together multiple layers whose dielectric values differ from one another, (2) forming at least one stacked via through the multilaminate circuit board, and (3) tuning the stacked via to achieve a certain characteristic by varying one or more features of the stacked via across the multiple layers to compensate for the differing dielectric values.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for achieving certain characteristics in stacked vias formed through multilaminate circuit boards. As will be explained in greater detail below, embodiments of the instant disclosure may compensate for and/or resolve differing and/or incompatible electrical characteristics of layers included in multilaminate circuit boards. For example, embodiments of the instant disclosure may compensate for differing dielectric values of layers included in multilaminate circuit boards by varying physical dimensions and/or drill sizes across segments of stacked vias. Additionally or alternatively, embodiments of the instant disclosure may form and/or provide gradual impedance changes and/or transitions across segments of stacked vias in multilaminate circuit boards. By doing so, these embodiments may mitigate, reduce, and/or eliminate reflections and/or interference in connection with high data rates supported by the multilaminate circuit boards.

The following will provide, with reference to FIG. 1-4, detailed descriptions of exemplary components, apparatuses, systems, configurations, and/or implementations for achieving certain characteristics in stacked vias formed through multilaminate circuit boards. In addition, the discussion corresponding to FIG. 5 will provide a detailed description of an exemplary method for achieving certain characteristics in stacked vias formed through multilaminate circuit boards.

Figure 1:
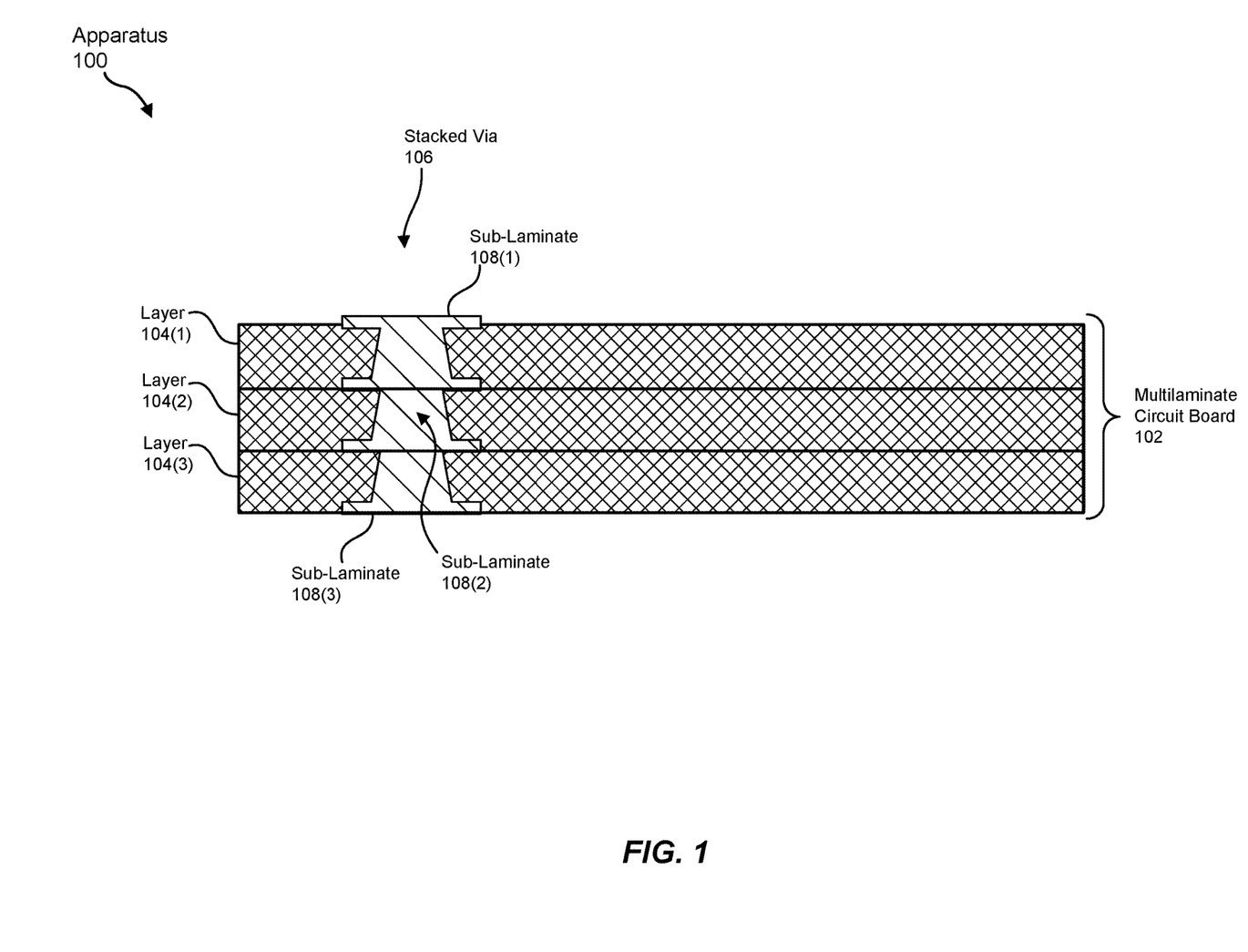
FIG. 1 is an illustration of an exemplary apparatus for certain characteristics in a stacked via formed through a multilaminate circuit board according to one or more embodiments of this disclosure.

FIG. 1 illustrates an exemplary apparatus 100 that includes and/or represents a multilaminate circuit board 102 comprised of layers 104(1), 104(2), and 104(3). In one example, some of layers 104(1)-(3) may include and/or represent dielectrics whose values differ from one another. As illustrated in FIG. 1, exemplary apparatus 100 may also include and/or represent a stacked via 106 incorporated in and/or formed through multilaminate circuit board 102. In this example, stacked via 106 may include and/or represent sub-laminate vias 108(1), 108(2), and 108(3) that span and/or extend across layers 104(1)-(3), respectively.

In one example, some of sub-laminate vias 108(1)-(3) may exhibit and/or be characterized by different physical features and/or attributes relative to one another. For example, the physical dimensions and/or sizes of sub-laminate vias 108(1)-(3) may vary relative to one another. As a specific example, the diameters and/or drill sizes of sub-laminate vias 108(1)-(3) may vary relative to one another. Additionally or alternatively, the lengths of sub-laminate vias 108(1)-(3) may vary relative to one another.

In one example, sub-laminate vias 108(1) and 108(3) may be formed and/or characterized in part by a 0.6-millimeter drill size, and sub-laminate via 108(2) may be formed and/or characterized in part by a 0.4-millimeter drill size. In this example, sub-laminate vias 108(1) and 108(3) may be formed and/or characterized by a 0.4-millimeter drill size, and sub-laminate via 108(2) may be formed and/or characterized in part by a 0.6-millimeter drill size. In a further example, sub-laminate via 108(1) may be formed and/or characterized in part by a 0.4-millimeter drill size, sub-laminate via 108(2) may be formed and/or characterized in part by a 0.6-millimeter drill size, and/or sub-laminate via 108(3) may be formed and/or characterized in part by a 0.8-millimeter drill size.

In one example, sub-laminate vias 108(1) and 108(3) may be formed and/or characterized in part by a 0.6-millimeter drill size, and sub-laminate via 108(2) may be formed and/or characterized in part by a 0.4-millimeter drill size. In another example, sub-laminate vias 108(1) and 108(3) may be formed and/or characterized by a 0.4-millimeter drill size, and sub-laminate via 108(2) may be formed and/or characterized in part by a 0.6-millimeter drill size. In a further example, sub-laminate via 108(1) may be formed and/or characterized in part by a 0.4-millimeter drill size, sub-laminate via 108(2) may be formed and/or characterized in part by a 0.6-millimeter drill size, and/or sub-laminate via 108(3) may be formed and/or characterized in part by a 0.8-millimeter drill size. Sub-laminate vias 108(1)-(3) may be formed and/or characterized by any combination and/or configuration of drill sizes to achieve certain characteristics (e.g., mitigation and/or reduction of reflections or interference) in stacked via 106 and/or multilaminate circuit board 102.

In one example, sub-laminate via 108(2) may have and/or be characterized by a length of 1.5 millimeters across layer 104(2), and sub-laminate vias 108(1) and 108(3) may have and/or be characterized by a length of 1 millimeter across layers 104(1) and 104(3), respectively. In another example, sub-laminate via 108(2) may have and/or be characterized by a length of 1 millimeter across layer 104(2), and sub-laminate vias 108(1) and 108(3) may have and/or be characterized by a length of 1.5 millimeters across layers 104(1) and 104(3), respectively. In a further example, sub-laminate via 108(1) may have and/or be characterized by a length of 1 millimeter across layer 104(1), sub-laminate via 108(2) may have and/or be characterized by a length of 1.5 millimeter across layer 104(2), and sub-laminate via 108(3) may have and/or be characterized by a length of 1.27 millimeters across layer 104(3). Sub-laminate vias 108(1)-(3) may have and/or be characterized by any combination of lengths to achieve certain characteristics (e.g., mitigation and/or reduction of reflections or interference) in stacked via 106 and/or multilaminate circuit board 102.

In some examples, the lengths of sub-laminate vias 108(1)-(3) may correspond to and/or follow the thicknesses of layers 104(1)-(3), respectively. For example, if sub-laminate vias 108(1) and 108(3) are shorter than sub-laminate via 108(2), then layers 104(1) and 104(3) may be less thick than layer 104(2). In another example, if sub-laminate vias 108(1) and 108(3) are longer than sub-laminate via 108(2), then layers 104(1) and 104(3) may be thicker than layer 104(2). In a further example, if sub-laminate vias 108(1) and 108(3) are longer than sub-laminate via 108(2), then layers 104(1) and 104(3) may be thicker than layer 104(2). Layers 104(1)-(3) may have and/or be characterized by any combination and/or configuration of thicknesses to achieve certain characteristics (e.g., mitigation and/or reduction of reflections or interference) in stacked via 106 and/or multilaminate circuit board 102.

In one example, some of sub-laminate vias 108(1)-(3) may exhibit and/or be characterized by different electrical features and/or attributes relative to one another. For example, the impedances of sub-laminate vias 108(1)-(3) may vary relative to one another. Additionally or alternatively, the capacitances of sub-laminate vias 108(1)-(3) may vary relative to one another. Sub-laminate vias 108(1)-(3) may have and/or be characterized by any combination of electrical features to achieve certain characteristics (e.g., mitigation and/or reduction of reflections or interference) in stacked via 106 and/or multilaminate circuit board 102.

In some examples, the varying physical and/or electrical characteristics of sub-laminate vias 108(1)-(3) may be tuned and/or tailored to compensate for differing dielectric values of layers 104(1)-(3) included in multilaminate circuit board 102. For example, the dielectric values of layers 104(1)-(3) may vary relative to one another. In one example, the dielectric value of layer 104(2) may be higher and/or greater than the dielectric value of layer 104(1) and/or layer 104(3). In this example, layer 104(2) may be positioned and/or situated proximate to the center of multilaminate circuit board 102. Additionally or alternatively, layers 104(1) and 104(3) may each be positioned and/or situated proximate to an outer boundary and/or side of multilaminate circuit board 102.

In some examples, layer 104(2) may include and/or contain materials that are more cost effective than those included and/or contained in layer 104(1) and/or layer 104(3). In one example, layer 104(2) may provide, facilitate, and/or support power and/or ground planes or signals for multilaminate circuit board 102. In this example, one or more of layers 104(1) and 104(3) may provide, facilitate, and/or support digital signals, such as high-speed data signals, for multilaminate circuit board 102. In certain implementations, layers 104(1) and 104(3) may be more costly than layer 104(2).

In some examples, multilaminate circuit board 102 may include and/or contain a variety of materials. Some of these materials may conduct electricity. Other materials included in multilaminate circuit board 102 may insulate the conductive materials from one another.

In some examples, multilaminate circuit board 102 may include and/or incorporate one or more electrically conductive materials in layers 104(1)-(3). In one example, each of layers 104(1)-(3) may include and/or represent a plane of conductive material that is etched during the fabrication process to create various conductive paths, tracks, and/or traces throughout multilaminate circuit board 102. In this example, the etched conductive paths, tracks, and/or traces may be separated from and/or interconnected with one another as necessary to form one or more circuits that incorporate electrical components and/or electronics across multilaminate circuit board 102. Examples of such electrically conductive materials include, without limitation, copper, aluminum, silver, gold, alloys of one or more of the same, combinations or variations of one or more of the same, and/or any other suitable materials.

In some examples, multilaminate circuit board 102 may include and/or incorporate insulating material that facilitates mounting (e.g., mechanical support) and/or interconnection (e.g., electrical coupling) of electrical and/or electronic components. In one example, multilaminate circuit board 102 may include and/or represent a printed circuit board (PCB). For example, each of layer 104(1)-(3) may include and/or represent a PCB. Accordingly, multilaminate circuit board 102 may constitute and/or represent a set of PCBs that are laminated together. Examples of multilaminate circuit board 102 include, without limitation, multilayer boards, motherboards, linecards, backplanes, midplanes, and/or any other suitable type of circuit board. Multilaminate circuit board 102 may be deployed and/or run in a computing device, such as a router, switch, gateway, network node, and/or end-point computer, among others.

In some examples, multilaminate circuit board 102 may be created and/or produced by a variety of fabrication processes. Examples of such fabrication processes include, without limitation, lamination, lithography, etching, deposition, chemical mechanical planarization, oxidation, ion implantation, photolithography, diffusion, combinations or variations of one or more of the same, and/or any other suitable fabrication processes. Various components may be laminated, etched, attached, and/or otherwise coupled to multilaminate circuit board 102.

In some examples, layers 104(1)-(3) may each include and/or represent sublaminates, insulation, and/or dielectric substances that electrically insulates the conductive materials from another. In one example, the insulation and/or dielectric substances may be disposed, laid out, and/or applied as planes and/or layers between each of the conductive planes and/or layer. In this example, the insulation and/or dielectric substances may constitute and/or represent a poor conductor of electricity. Additionally or alternatively, the insulation and/or dielectric substances may be polarized by an applied electric field.

In some examples, one or more of layers 104(1)-(3) may include and/or represent a plurality of sub-layers. For example, layers 104(1)-(3) may each include and/or represent a sub-lamination. In this example, each sub-lamination may include and/or represent one or more layers. Accordingly, although not necessarily illustrated in this way in FIG. 1, sub-laminate vias 108(1)-(3) may each span and/or extend across one or more layers.

Dielectric substances may be implemented as solids, liquids, and/or gases. Examples of dielectric substances include, without limitation, porcelains, glasses, plastics, industrial coatings, silicon, germanium, gallium arsenide, mica, metal oxides, silicon dioxides, sapphires, aluminum oxides, polymers, ceramics, variations or combinations of one or more of the same, and/or any other suitable dielectric substances.

In some examples, multilaminate circuit board 102 may be fabricated in any of a variety of ways, including sequential lamination. For example, as part of a sequential lamination process, multilaminate circuit board 102 may be fabricated layer by layer, using certain subcomposites of copper and insulating materials. In this example, the sequential lamination process may facilitate trace routing and/or via drilling within internal planes and/or layers, such as layers 104(1)-(3).

In some examples, multilaminate circuit board 102 may include and/or form a symmetrical configuration of layers. In other examples, multilaminate circuit board 102 may include and/or form an asymmetrical configuration of layers.

In some examples, stacked via 106 and/or sub-laminate vias 108(1)-(3) may be plated and/or electrically coupled to establish continuity across some or all of layers 104(1)-(3). In one example, stacked via 106 and/or sub-laminate vias 108(1)-(3) may each include and/or represent a drilled hole that has been fully or partially plated with electrically conductive material to create and/or form a conductive path and/or bridge from one or more of layers 104(1)-(3) and/or conductive planes to certain electrical components. In this example, one or more of sub-laminate vias 108(1)-(3) may be insulated and/or isolated from the conductive material on one or more of layers 104(1)-(3) by way of antipads and/or non-functional pads.

Figure 2:
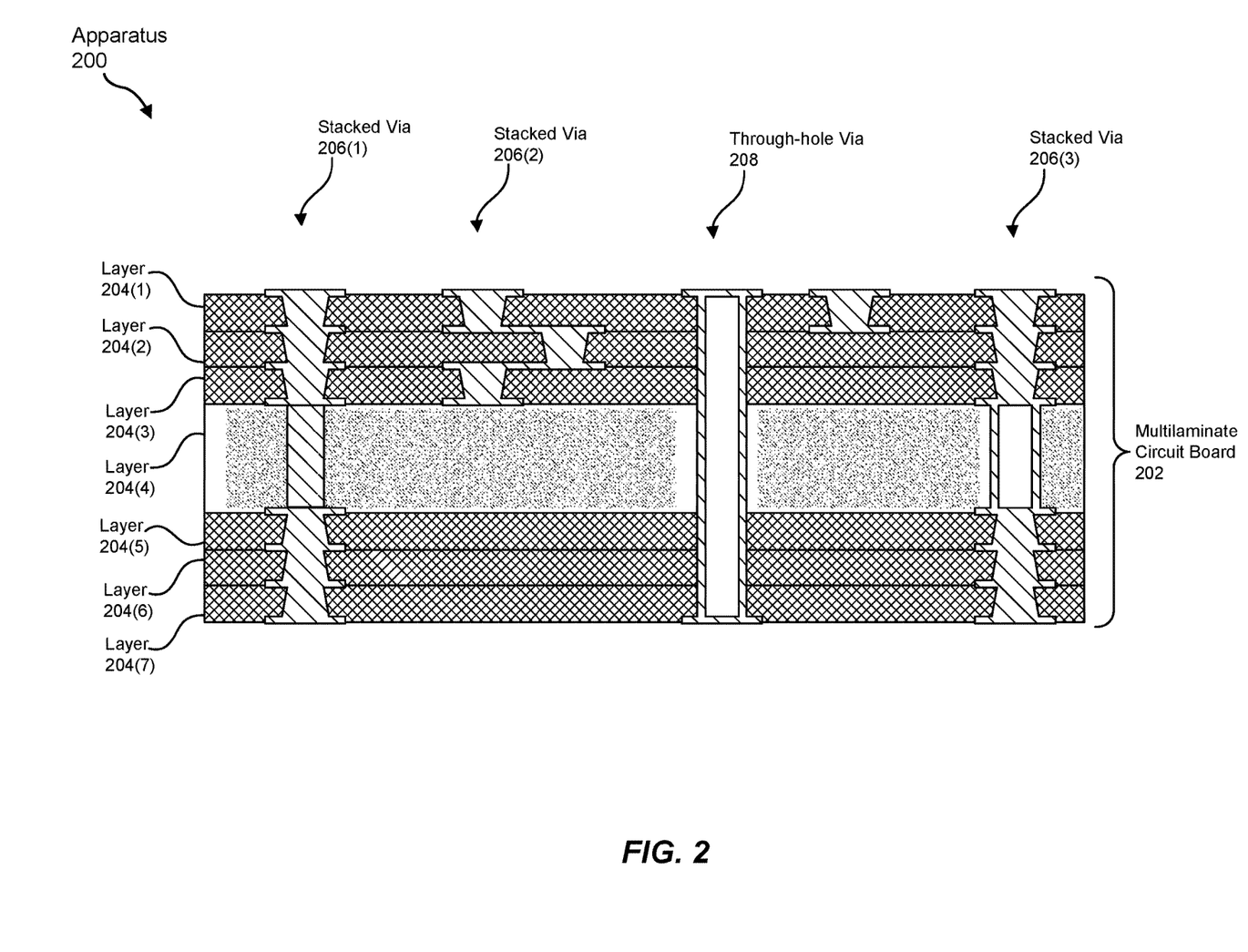
FIG. 2 is an illustration of an exemplary apparatus for certain characteristics in a stacked via formed through a multilaminate circuit board according to one or more embodiments of this disclosure.

FIG. 2 illustrates an exemplary apparatus 200 that includes and/or represents a multilaminate circuit board 202 comprised of layers 204(1), 204(2), 204(3), 204(4), 204(5), 204(6), and 204(7). In some examples, apparatus 200 may include and/or represent certain components, configurations, and/or features that perform and/or provide functionalities that are similar and/or identical to those described above in connection with FIG. 1. In one example, multilaminate circuit board 202 may include and/or represent stacked vias 206(1), 206(2), and 206(3) that span and/or extend across some or all of layers 204(1)-(7). In this example, stacked via 206(1)-(3) may each include and/or represent various sub-laminate vias that form bridges and/or connections across some or all of layers 204(1)-(7). Additionally or alternatively, multilaminate circuit board 202 may include and/or represent a through-hole via 208 that spans and/or extends across layers 204(1)-(7).

In some examples, stacked vias 206(1)-(3) may each include and/or represent a set of sub-laminate vias. In one example, each sub-laminate via included in stacked vias 206(1)-(3) may span and/or extend across one or more of layer 204(1)-(7). For example, one sub-laminate via included in stacked via 206(1) may span and/or extend across layers 204(1)-(3). In this example, another sub-laminate via included in stacked via 206(1) may span and/or extend across only layer 204(5).

In some examples, the sub-laminate vias included in stacked vias 206(1)-(3) may exhibit and/or be characterized by different physical and/or electrical features or attributes relative to one another. In one example, stacked vias 206(1) and 206(3) may include and/or represent substantially linear and/or direct connections and/or platings across layers 204(1) and 204(3), respectively. Additionally or alternatively, the sub-laminate vias included in stacked via 206(2) may be staggered and/or offset relative to one another across layers 204(1)-(3).

Figure 3:
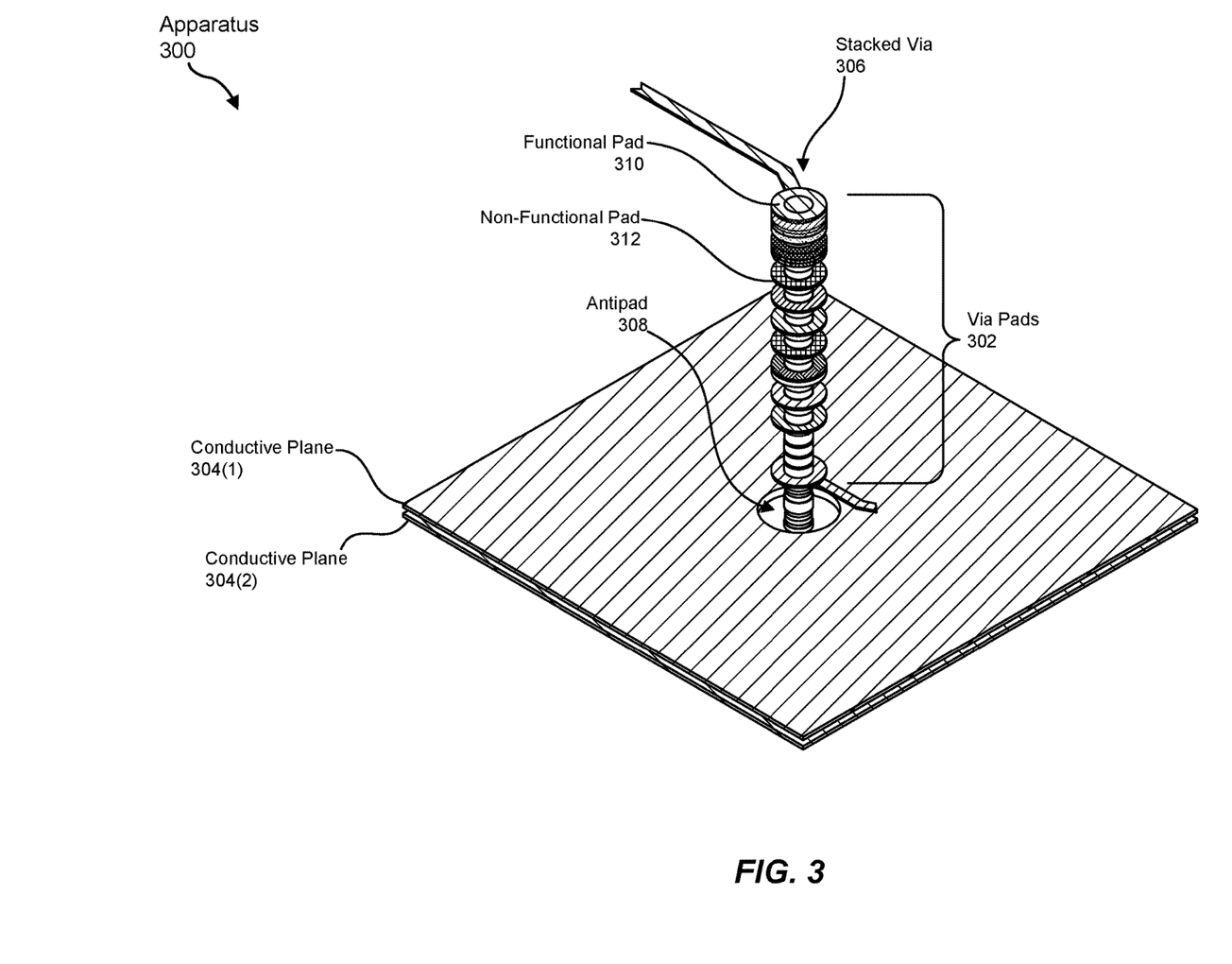
FIG. 3 is an illustration of an exemplary apparatus for certain characteristics in a stacked via formed through a multilaminate circuit board according to one or more embodiments of this disclosure.

FIG. 3 illustrates an exemplary apparatus 300 that includes and/or represents a stacked via 306 that is largely isolated and/or exposed without the explicit portrayal of certain layer materials. In some examples, apparatus 300 may include and/or represent certain components, configurations, and/or features that perform and/or provide functionalities that are similar and/or identical to those described above in connection with either FIG. 1 or FIG. 2.

In one example, stacked via 306 may be electrically and/or communicatively coupled to via pads 302 included in different layers of a multilaminate circuit board. In this example, via pads 302 may include and/or represent any combination and/or configuration of functional pads, non-functional pads, and/or antipads to achieve certain characteristics in stacked via 306.

In some examples, via pads 302 may include and/or represent a functional pad 310 that electrically and/or communicatively couples or connects a sub-laminate via to one or more traces, conductive paths, and/or electrical components on a specific layer of the multilaminate circuit board. In other words, the sub-laminate via may be electrically and/or communicatively coupled to functional pad 310 on the specific layer containing and/or forming the traces, conductive paths, and/or electrical components.

In some examples, via pads 302 may include and/or represent a non-functional pad 312 that is electrically and/or communicatively isolated and/or unconnected from all traces, conductive paths, and/or electrical components on a specific layer of the multilaminate circuit board. In other words, the sub-laminate via may be electrically and/or communicatively coupled to non-functional pad 312 on the specific layer of the multilaminate circuit board, but non-functional pad 312 may be electrically and/or communicatively isolated and/or unconnected from all traces, conductive paths, and/or electrical components on that layer.

In some examples, via pads 302 may include and/or represent an antipad 308 that physically and/or electrically isolates or decouples a layer of the multilaminate circuit board from stacked via 306. For example, antipad 308 may include and/or represent a void area, space, cutout, and/or opening that surrounds stacked via 306 in the multilaminate circuit board. In this example, the layer on which antipad 308 is formed may include and/or represent conductive material, such as conductive planes 304(1) and 304(2). Accordingly, stacked via 306 may be physically and/or electrically decoupled from the layer on which antipad 308 is formed.

In some examples, via pads 302 may exhibit and/or be characterized by different physical features and/or attributes relative to one another. For example, the physical dimensions, sizes, and/or materials of via pads 302 may vary relative to one another. Via pads 302 may have and/or be characterized by any combination and/or configuration of physical dimensions, sizes, and/or materials to achieve certain characteristics (e.g., mitigation and/or reduction of reflections or interference) in stacked via 106.

In some examples, one or more functional and/or non-functional pads may be disposed and/or applied along stacked via 306 to increase and/or tune the impedance and/or capacitance of stacked via 306 and/or its constituent sub-laminate vias. With such increased and/or tuned impedance, stacked via 306 and/or its constituent sub-laminate vias may be able to mitigate and/or reduce undesirable reflections and/or interference in connection with high-speed data signals traversing the multilaminate circuit board. In one example, the appropriate and/or optimal impedance for stacked via 306 and/or its constituent sub-laminate vias may depend on the dielectric material surrounding the functional and/or non-functional pads.

Figure 4:
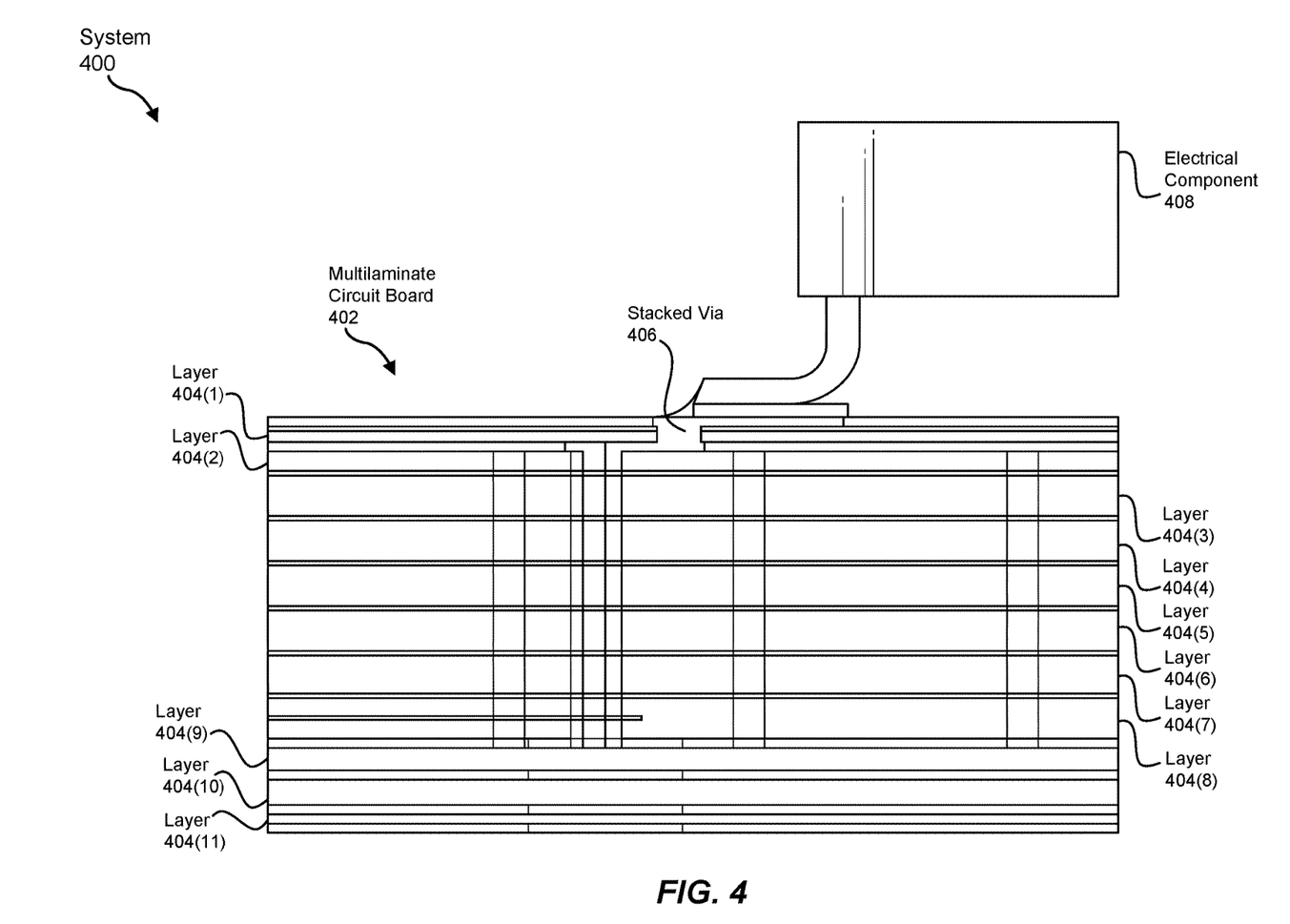
FIG. 4 is an illustration of an exemplary apparatus for certain characteristics in a stacked via formed through a multilaminate circuit board according to one or more embodiments of this disclosure.

FIG. 4 illustrates an exemplary system 400 that includes and/or represents an electrical component 408 physically and/or electrically coupled to a multilaminate circuit board 402. In some examples, system 400 may include and/or represent certain components, configurations, and/or features that perform and/or provide functionalities that are similar and/or identical to those described above in connection with any FIGS. 1-3. In one example, multilaminate circuit board 402 may include and/or represent layers 404(1), 404(2), 404(3), 404(4), 404(5), 404(6), 404(6), 404(7), 404(8), 404(9), 404(10), and 404(11). In this example, multilaminate board 402 may also include and/or represent a stacked via 406 that spans and/or extends across layers 404(1)-(11).

In some examples, electrical component 408 may be soldered and/or fixed to a conductive pad disposed on layer 404(1) of multilaminate circuit board 402. In one example, the conductive pad may be electrically and/or communicatively coupled to stacked via 406. In this example, stacked via 406 may provide electrical and/or communicative continuity between electrical component 408 and one or more of layers 404(1)-(11).

In some examples, electrical component 408 may include and/or represent any type or form of passive and/or active electrical device and/or feature. In one example, electrical component 408 may include and/or represent an application specific integrated circuit (ASIC) and/or a system on a chip (SoC). Additional examples of electrical component 408 include, without limitation, processors, central processing units (CPUs), microprocessors, microcontrollers, field programmable gate arrays (FPGAs), parallel accelerated processors, tensor cores, integrated circuits, chiplets, transistors, diodes, resistors, capacitors, inductors, transducers, sensors, antennas, transceivers, transmitters, receivers, resonators, switches, optical devices, conductors, portions of one or more of the same, combinations or variations of one or more of the same, and/or any other suitable electrical component.

In some examples, stacked via 406 may exhibit and/or implement gradual changes and/or transitions of impedance. For example, to avoid abrupt impedance changes, stacked via 406 may exhibit and/or implement an impedance gradient across layers 404(1)-(11). In this example, the impedance gradient may enable stacked via 406 to mitigate and/or reduce reflections caused by impedance discontinuities.

In some examples, the analysis for determining the optimal features of a multilaminate circuit board may be painstaking and/or time-consuming. Accordingly, this analysis may be performed by an automation tool that calculates and/or determines the appropriate features for a given stacked via. For example, a set of specific parameters (e.g., power, frequency, board layout, number of layers, electrical features, physical dimensions, etc.) corresponding to a proposed circuit design may be entered into an automation tool. In this example, the automation tool may simulate the electrical and/or electromagnetic characteristics of a multilaminate circuit board that implements the proposed circuit design.

In some examples, as part of this simulation, the automation tool may modify and/or iterate over certain features (e.g., physical dimensions, electrical characteristics, etc.) of various sub-laminate vias included in one or more stacked vias using a script. Upon converging on the optimal features for the stacked vias under test, the automation tool may export and/or render an electronic and/or data representation of those features for the stacked vias. In one example, the electronic and/or data representation of those features for the stacked vias may be imported and/or inputted to a PCB layout tool.

In some examples, the various apparatuses, devices, and/or systems described in connection with FIGS. 1-4 may include and/or represent one or more additional circuits, components, and/or features that are not necessarily illustrated and/or labeled in FIGS. 1-4. For example, apparatuses 100, 200, and 300 or system 400 may also include and/or represent additional analog and/or digital circuitry, onboard logic, transistors, antennas, resistors, capacitors, diodes, inductors, switches, registers, flipflops, connections, traces, buses, semiconductor (e.g., silicon) devices and/or structures, processing devices, storage devices, circuit boards, packages, substrates, housings, combinations or variations of one or more of the same, and/or any other suitable components.

In certain implementations, one or more of these additional circuits, components, and/or features may be inserted and/or applied between any of the existing circuits, components, and/or features illustrated in FIGS. 1-4 consistent with the aims and/or objectives described herein. Accordingly, the electrical and/or communicative couplings described with reference to FIGS. 1-4 may be direct connections with no intermediate components, devices, and/or nodes or indirect connections with one or more intermediate components, devices, and/or nodes.

In some examples, the phrase "to couple" and/or the term "coupling", as used herein, may refer to a direct connection and/or an indirect connection. For example, a direct coupling between two components may constitute and/or represent a coupling in which those two components are directly connected to each other by a single node that provides electrical continuity from one of those two components to the other. In other words, the direct coupling may exclude and/or omit any additional components between those two components.

Additionally or alternatively, an indirect coupling between two components may constitute and/or represent a coupling in which those two components are indirectly connected to each other by multiple nodes that fail to provide electrical continuity from one of those two components to the other. In other words, the indirect coupling may include and/or incorporate at least one additional component between those two components.

Figure 5:
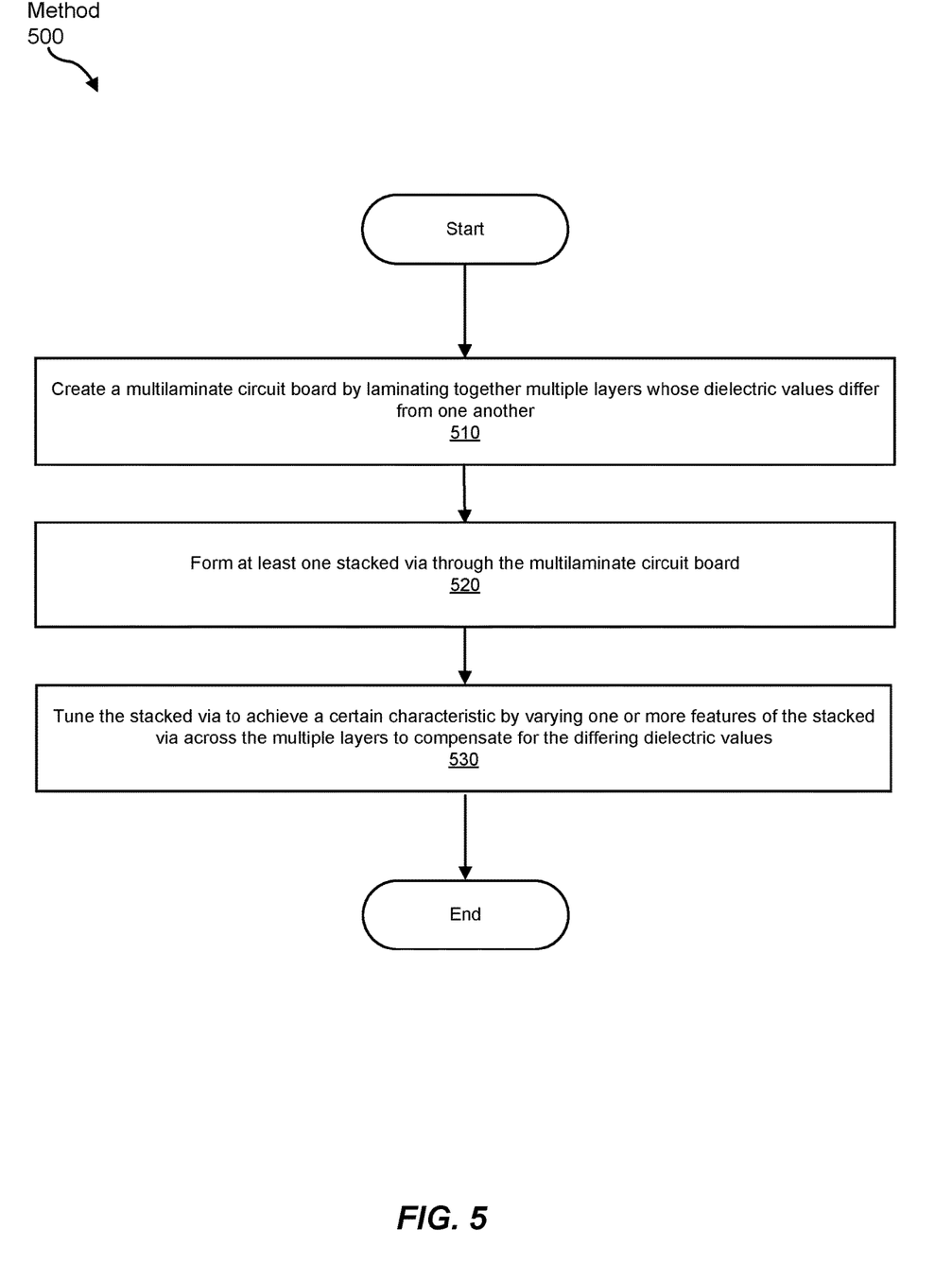
FIG. 5 is a flow diagram of an exemplary method for achieving certain characteristics in stacked vias formed through multilaminate circuit boards according to one or more embodiments of this disclosure.

FIG. 5 is a flow diagram of an exemplary method 500 for achieving certain characteristics in stacked vias formed through multilaminate circuit boards. In one example, the steps shown in FIG. 5 may be performed by a controller incorporated into and/or associated with a computing device powered by a PSU. Additionally or alternatively, the steps shown in FIG. 5 may incorporate and/or involve certain sub-steps and/or variations consistent with the descriptions provided above in connection with FIGS. 1-4.

As illustrated in FIG. 5, method 500 may include and/or involve the step of creating a multilaminate circuit board by laminating together multiple layers whose dielectric values differ from one another (510). Step 510 may be performed in a variety of ways, including any of those described above in connection with FIGS. 1-4. For example, a circuit board manufacturer or subcontractor may create a multilaminate circuit board by laminating together multiple layers whose dielectric values differ from one another.

Method 500 may also include and/or involve the step of forming at least one stacked via through the multilaminate circuit board (520). Step 520 may be performed in a variety of ways, including any of those described above in connection with FIGS. 1-4. For example, the circuit board manufacturer or subcontractor may form at least one stacked via through the multilaminate circuit board. In one example, the circuit board manufacturer or subcontractor may create and/or produce each of the layers and/or sub-laminate vias individually and then laminate the layers together. The lamination of these layers may electrically and/or communicatively couple the sub-laminate vias together to form the stacked via.

Method 500 may further include and/or involve the step of tuning the stacked via to achieve a certain characteristic by varying one or more features of the stacked via across the multiple layers to compensate for the differing dielectric values (530). Step 530 may be performed in a variety of ways, including any of those described above in connection with FIGS. 1-4. For example, the circuit board manufacturer or subcontractor may tune the stacked via to achieve a certain characteristic by varying one or more features of the stacked via across the multiple layers to compensate for the differing dielectric values.

In some examples, one or more of the exemplary embodiments disclosed herein may be encoded as a computer program (also referred to as computer software, software applications, computer-readable instructions, and/or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of apparatus 100 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a multilaminate circuit board that includes multiple layers whose dielectric values differ from one another; and
   at least one stacked via formed through the multilaminate circuit board, wherein the stacked via comprises:
      a first sub-laminate via that spans a first layer included in the multiple layers and is characterized by a fire drill size and a first capacitance; and
      a second sub-laminate via that spans a second layer included in the multiple layers and is characterized by a second drill size that differs from the first drill size and a second capacitance that differs from the first capacitance, the stacked via being turned to achieve a certain impedance by varying the first drill size and the second drill size to achieve the first capacitance and the second capacitance, wherein the first capacitance and the second capacitance compensate for the different dielectric values of the multiple layers to mitigate reflections or interference in connection with a high-speed signal supported by the multilaminate circuit board.

2. The apparatus of claim 1, wherein:
   the first layer has a certain dielectric value; and
   the second layer has another dielectric value that is greater than the certain dielectric value.

3. The apparatus of claim 1, wherein:
   the second layer is positioned proximate to a center of the multilaminate circuit board; and
   the first layer positioned proximate to an outer boundary of the multilaminate circuit board.

4. The apparatus of claim 1, wherein:
   the second layer supports a power signal or a ground signal; and
   the first layer supports at least one digital signal.

5. The apparatus of claim 1, wherein the multiple layers further comprise a third layer that supports the high-speed signal and is positioned proximate to another outer boundary of the multilaminate circuit board.

6. The apparatus of claim 1, wherein:
   the first sub-laminate via is characterized by a first diameter; and
   the second sub-laminate via is characterized by a second diameter that differs from the first diameter.

7. The apparatus of claim 1, wherein:
   the first sub-laminate via is characterized by a first length; and
   the second sub-laminate via is characterized by a second length that differs from the first length.

8. The apparatus of claim 1, wherein:
   the first sub-laminate via is characterized by a first impedance; and
   the second sub-laminate via is characterized by a second impedance that differs from the first impedance.

9. The apparatus of claim 1, wherein:
   the first sub-laminate via is characterized by at least one non-functional pad; and
   the second sub-laminate via is characterized by at least one functional pad.

10. The apparatus of claim 1, further comprising at least one other stacked via formed through the multilaminate circuit board, wherein the other stacked via comprises:
    a sub-laminate via that spans the first layer included in the multiple layers and is characterized by a certain feature; and
    another sub-laminate via that spans the second layer included in the multiple layers and is characterized by a different feature.

11. A system comprising:
    at least one electrical component;
    a multilaminate circuit board communicatively coupled to the electrical component, wherein the multilaminate circuit board includes multiple layers whose dielectric values differ from one another; and
    at least one stacked via formed through the multilaminate circuit board, wherein the stacked via comprises:
       a first sub-laminate via that spans a first layer included in the multiple layers and is characterized by a first drill size and a first capacitance; and
       a second sub-laminate via that spans a second layer included in the multiple layers and is characterized by a second drill size that differs from the first drill size and a second capacitance that differs from the first capacitance, the stacked via being turned to achieve a certain impedance by varying the first drill size and the second drill size to achieve the first capacitance and the second capacitance, wherein the first capacitance and the second capacitance compensate for the different dielectric values of the multiple layers to mitigate reflections or interference in connection with a high-speed signal supported by the multilaminate circuit board.

12. The system of claim 11, wherein:
    the first layer has a certain dielectric value; and
    the second layer has another dielectric value that is greater than the certain dielectric value.

13. The system of claim 11, wherein:
    the second layer is positioned proximate to a center of the multilaminate circuit board; and the first layer positioned proximate to an outer boundary of the multilaminate circuit board.

14. The system of claim 11, wherein:
the second layer supports a power signal or a ground signal; and
the first layer supports at least one digital signal.

\* \* \* \* \*

UNITED STATES PATENT AND TRADEMARK OFFICE
CERTIFICATE OF CORRECTION

PATENT NO. : 12,349,267 B1  
APPLICATION NO. : 18/300925  
DATED : July 1, 2025  
INVENTOR(S) : Rust-Nguyen Page 1 of 1

It is certified that error appears in the above-identified patent and that said Letters Patent is hereby corrected as shown below:

In the Claims

Claim 1, Column 11, Lines 44-45 should read --in the multiple layers and is characterized by a first drill size and a first capacitance; and--.

Claim 1, Column 11, Line 50 should read --first capacitance, the stacked via being tuned to--.

Claim 11, Column 12, Line 53 should read --first capacitance, the stacked via being tuned to--.

Signed and Sealed this  
Eleventh Day of November, 2025

John A. Squires  
*Director of the United States Patent and Trademark Office*